(12) United States Patent
Humpston et al.

(10) Patent No.: US 7,510,401 B2
(45) Date of Patent: Mar. 31, 2009

(54) MICROELECTRONIC COMPONENT WITH FOAM-METAL POSTS

(75) Inventors: Giles Humpston, Aylesbury (GB); Jesse Burl Thompson, Brentwood, CA (US)

(73) Assignee: Tessera, Inc., San Jose, CA (US)

( * ) Notice: Subject to any disclaimer, the term of this patent is extended or adjusted under 35 U.S.C. 154(b) by 2 days.

(21) Appl. No.: 11/546,899

(22) Filed: Oct. 12, 2006

(65) Prior Publication Data

US 2008/0090427 A1    Apr. 17, 2008

(51) Int. Cl.
    *H01R 12/00*    (2006.01)
(52) U.S. Cl. .......................................................... 439/66
(58) Field of Classification Search ..................... 439/66
    See application file for complete search history.

(56) References Cited

U.S. PATENT DOCUMENTS

| | | | |
|---|---|---|---|
| 5,189,505 A | 2/1993 | Bartelink | |
| 5,397,997 A | 3/1995 | Tuckerman et al. | |
| 5,731,709 A | 3/1998 | Pastore et al. | |
| 6,258,625 B1 | 7/2001 | Brofman et al. | |
| 6,458,411 B1 | 10/2002 | Goossen et al. | |
| 6,495,914 B1 | 12/2002 | Sekine et al. | |
| 6,550,666 B2 | 4/2003 | Chew et al. | |
| 6,578,754 B1 | 6/2003 | Tung | |
| 6,624,653 B1 | 9/2003 | Cram | |
| 6,799,977 B2 * | 10/2004 | Liu ............................. | 439/66 |

FOREIGN PATENT DOCUMENTS

JP    62-68015 A    9/1994

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
North Corporation, "Processed Intra-layer Interconnection Material for PWBs [Etched Copper Bump with Copper Foil]." NMBI™, Version 2001.6., date prior to this instant application, 1 page.

* cited by examiner

*Primary Examiner*—Truc T Nguyen
(74) *Attorney, Agent, or Firm*—Lerner, David, Littenberg, Krumholz & Mentlik, LLP

(57) ABSTRACT

A microelectronic component having a base and a plurality of conductive posts extending from said base. Each of the posts is formed from a connected lattice of metal having voids therein. The lattice may be formed by depositing metal onto a sacrificial element such as an open-celled polymeric foam. During use or during processing, the posts may be deformed, as by crushing the lattice.

9 Claims, 8 Drawing Sheets

MICROELECTRONIC COMPONENT WITH FOAM-METAL POSTS

BACKGROUND OF THE INVENTION

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Certain types of packages have been developed which utilize a microelectronic component having a flexible dielectric substrate having conductive traces disposed thereon. In such an arrangement, electrically conductive posts or pillars project from a surface of the flexible substrate. Each post is connected to a portion of one of the traces. This type of microelectronic component is particularly useful in chip packages having arrangements that allow each post to move independently of the other posts. The movement of the posts allows the tips of the plural posts to simultaneously engage contact pads on a circuit board despite irregularities in the circuit board or the package, such as warpage of the circuit board. Additionally, this facilitates testing of the package using simple test boards which may have substantially planar contacts, and avoids the need for specialized, expensive test sockets.

This type of microelectronic component has various applications and can be used in a number of different microelectronic package arrangements. As disclosed in certain preferred embodiments of U.S. patent application Ser. Nos. 11/014,439; 10/985,119; and 10/985,126, the disclosures of which are incorporated by reference herein, one such microelectronic package can include a microelectronic element such as a semiconductor chip and a microelectronic component comprising a flexible substrate spaced from and overlying a first face of the microelectronic element. Such a component can include a plurality of conductive posts extending from the flexible substrate and projecting away from the microelectronic element, at least some of the conductive posts being electrically interconnected with said microelectronic element. Such posts are typically fabricated from a solid metal, which is typically either copper, copper alloy, gold or combination of these materials. Additionally, such a package can include a plurality of support elements disposed between the microelectronic element and the substrate and supporting the flexible substrate over the microelectronic element. Desirably, at least some of the conductive posts are offset in horizontal directions parallel to the plane of the flexible substrate from the support elements. For example, the support elements may be disposed in an array with zones of the flexible substrate disposed between adjacent support elements, and the posts may be disposed near the centers of such zones.

The offset between the posts and the support elements allows the posts, and particularly the bases of the posts adjacent the substrate, to move relative to the microelectronic element. This arrangement can allow each post to move independently of the other posts. This movement of the posts is provided by the low modulus of elasticity of the flexible substrate. Typically, the flexible substrate is made from polyimide, which has a modulus of elasticity of about 2 GPa to 5 GPa. The modulus of elasticity of the conductive posts, by comparison, is typically about 120 GPa, which means that in such a package the conductive posts are effectively rigid and unyielding. Further, such an arrangement effectively has no range of plastic deformation because the stress required to achieve plastic deformation of a solid metal pin exceeds values that would likely damage the semiconductor component of a printed circuit board (PCB) to which the structure is mated.

The flexible substrate can overlie the front or contact-bearing face of the microelectronic element. In this arrangement at least some of the support elements desirably are electrically conductive elements such as solder balls. The conductive support elements may electrically interconnect at least some of the contacts of the microelectronic element with at least some of the conductive posts. In preferred forms, this arrangement can provide low-impedance conductive paths between the posts and the microelectronic element, suitable for high-frequency signal transmission. At least some of the posts can be connected to at least some of the contacts on the microelectronic element by conductive support elements immediately adjacent to those posts. It is advantageous that conductive traces provided on the flexible substrate electrically interconnect at least some of the conductive posts with at least some of the conductive support elements. These traces may be very short; the length of each trace desirably being equal to the offset distance between a single post and a single support element.

The flexible dielectric substrate utilized in such a microelectronic component includes a top surface and a bottom surface remote therefrom. Although the thickness of the dielectric substrate will vary with the application, the dielectric substrate most typically is about 10 μm-100 μm thick. The flexible sheet has conductive traces thereon. In one embodiment the conductive traces are disposed on the bottom surface of the flexible sheet. However, in other embodiments the conductive traces may extend on the top surface of the flexible sheet, on both the top and bottom faces or within the interior of flexible substrate. The thickness of the traces will also vary with the application, but typically is about 5 μm-25 μm. Traces are arranged so that each trace has a support end and a post end remote from the support end.

The dielectric sheet, traces and posts can be fabricated by a process such as that disclosed in co-pending, commonly assigned U.S. patent application Ser. No. 10/959,465, the disclosure of which is incorporated by reference herein. As disclosed in greater detail in the '465 Application, a metallic plate is etched or otherwise treated to form numerous metallic posts projecting from the plate. A dielectric layer is applied to this plate so that the posts project through the dielectric layer. An inner side of the dielectric layer faces toward the metallic plate, whereas the outer side of the dielectric layer faces towards the tips of the posts. Previously, this dielectric layer has been fabricated by forcibly engaging the posts with the dielectric sheet so that the posts penetrate through the sheet. Alternatively, the dielectric sheet may be provided with an array of pre-formed holes at the locations of the posts, and attached to the plate with an adhesive. Once the sheet is in place, the metallic plate is etched to form individual traces on the inner side of the dielectric layer. Alternatively, conventional processes such as plating or etching may form the traces, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner that connects the posts to the traces. The composition and design of these posts, in combination with the methods used to either form them with the microelectronic component or to assemble them therewith, require narrow tolerances in order to ensure that the respective heights of the posts above the dielectric layer are substantially equal. Such narrow tolerances lead to increases in both the cost of the microelectronic packages and the time required for their manufacture.

Despite the aforementioned advances in the art, still further improvements in microelectronic components would be desirable.

SUMMARY OF THE INVENTION

One embodiment of the present invention provides a microelectronic component having a base and a plurality of conductive posts extending from the base. Each of the plurality of conductive posts is formed from a connected lattice of metal having voids therein.

Another aspect of the present invention provides a microelectronic package including a microelectronic component having faces and contacts, and a flexible substrate spaced from and overlying a first face of the microelectronic component. A plurality of conductive posts extend from the flexible substrate and project away from the first face of the microelectronic component, at least some of the conductive posts being electrically interconnected with the microelectronic component. Each of the plurality of conductive posts has a volume thereof and is formed from a connected lattice of metal in which the lattice constitutes less than half of the volume of the conductive post. A plurality of support components are disposed between the microelectronic component and the substrate and support the flexible substrate over the microelectronic component. At least some of the conductive posts are offset from the support components.

A further aspect of the present invention relates to a method of forming a microelectronic connection component including treating an in-process unit having a substrate, a conductive element exposed at a face of the flexible substrate and a sacrificial element projecting away from the trace and having a plurality of internal members by deposing a chemical vapor into the sacrificial element such that said internal members are coated with a metal so as to form a conductive post.

A still further aspect of the present invention relates to a method for processing a microelectronic component. The method includes the step of advancing a microelectronic component having a base and a plurality of conductive posts extending from the base, each of the plurality of conductive posts having a volume thereof and being formed from a connected lattice of metal having voids therein, until tips of the posts engage contact pads and at least one of the posts deforms. The contact pads may comprise a test circuit board, and the method may further include the step of testing the microelectronic package. Alternatively, the contact pads may comprise a circuit panel and the method may further include the step of affixing the posts to the contact pads.

A further aspect of the present invention provides a method for processing a microelectronic component including the step of advancing a microelectronic component having a base and a plurality of conductive posts extending from the base, each of the plurality of conductive posts having a tip portion and being formed from a connected lattice of metal having voids therein, until the tips of the posts engage a substantially flat surface such that a selected one of said posts deforms. Each of the plurality of posts may have a height thereof, and the deformation may include compression of the selected post such that the height of the selected post is substantially equal to the height of another one of the plurality of posts. Further, the deformation may include forming a substantially flat surface on the tip of the selected post.

BRIEF DESCRIPTION OF THE DRAWINGS

The present invention will be better understood on reading the following detailed description of non-limiting embodiments thereof, and on examining the accompanying drawings, in which.

DETAILED DESCRIPTION

Figure 1:
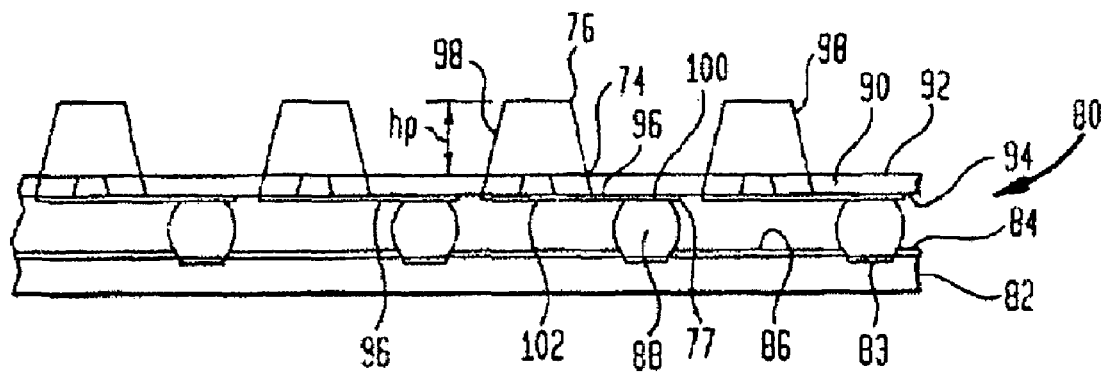
FIG. 1 is an elevation view of a microelectronic component in accordance with one embodiment of the present invention.

Referring now to the drawings, wherein like reference numerals represent like elements, there is shown in FIG. 1 a microelectronic package 80, in accordance with one embodiment of the present invention. Microelectronic package 80 includes a microelectronic element, such as a semiconductor chip 82 having a front or contact bearing face 84 and electrical contacts 83 exposed at face 84. A passivation layer 86 may be formed over the contact bearing face 84 with openings at contacts 83.

Figure 2:
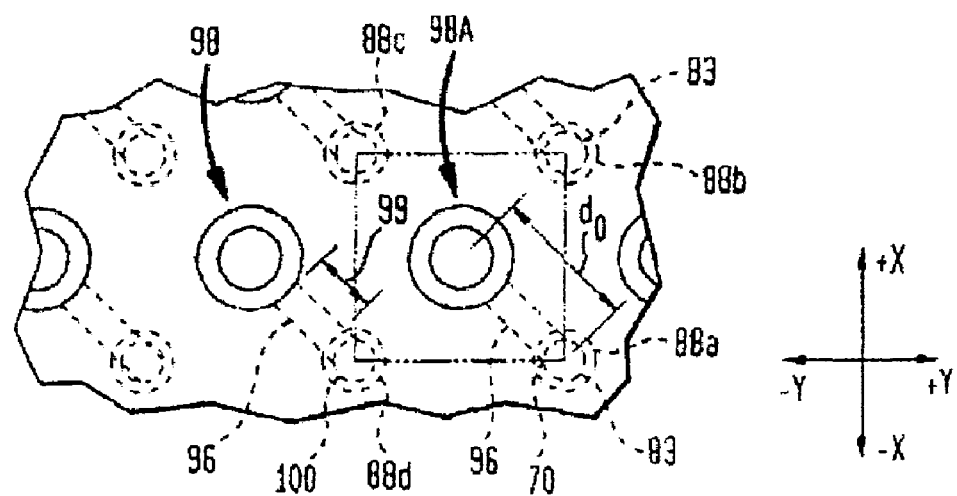
FIG. 2 is a top view of a microelectronic component in accordance with one embodiment of the present invention.

The microelectronic package 80 also includes conductive support elements 88 such as solder balls in substantial alignment and electrically interconnected with contacts 83. As best seen in FIG. 2, contacts 83 and support elements 88 are disposed in an array which in this case is a rectilinear grid, having equally spaced columns extending in a first horizontal direction x and equally spaced rows extending in a second horizontal direction y orthogonal to the first horizontal direction. Each contact 83 and support element 88 is disposed at an intersection of a row and a column, so that each set of four support elements 88 at adjacent intersections, such as support elements 88a, 88b, 88c and 88d, defines a generally rectangular, and preferably square, zone 89. Other zone shapes may be used. The directions referred to in this disclosure are directions in the frame of reference of the components themselves, rather than in the normal gravitational frame of reference. Horizontal directions are directions parallel to the plane of the front surface 84 of the chip, whereas vertical directions are perpendicular to that plane.

The package also includes a flexible dielectric substrate 90, such as a polyimide or other polymeric sheet, including a top surface 92 and a bottom surface 94 remote therefrom. Although the thickness of the dielectric substrate will vary with the application, the dielectric substrate most typically is about 10 μm-100 μm thick. The flexible sheet 90 has conductive traces 96 thereon. In the particular embodiment illustrated in FIG. 1, the conductive traces are disposed on the bottom surface 94 of the flexible sheet 90. However, in other embodiments, the conductive traces 96 may extend on the top surface 92 of the flexible sheet 90, on both the top and bottom faces or within the interior of flexible substrate 90. Thus, as used in this disclosure, a statement that a first feature is disposed "on" a second feature should not be understood as requiring that the first feature lie on a surface of the second feature. Conductive traces 96 may be formed from any electrically conductive material, but most typically are formed from copper, copper alloys, gold or combinations of these materials. The thickness of the traces will also vary with the application, but typically is about 5 μm-25 μm. Traces 96 are arranged so that each trace has a support end 100 and a post end 102 remote from the support end.

Electrically conductive posts or pillars 98 project from the top surface 92 of flexible substrate 90. Posts 98 are made of a metal foam material. Foam metals have previously been used for battery electrodes, filters, catalysts and catalyst supports and are typically manufactured from metals with good conductive properties such as nickel, copper, gold and aluminum. Nickel, gold, and copper are preferred materials for posts 98 due to their conductive properties. The term "metal foam" is used herein to define nearly any kind of metallic material which contains voids. In such an arrangement, the metallic portion of the metal foam is in the form of a connected lattice of metal. "True" metal foams are formed by dispersing gas bubbles in molten metal, thereby forming a liquid foam, which is then cooled into a solid metal foam. However, other metal structures containing voids exist, which are generally considered to be metal foams, and include cellular metal, porous metal, and metallic sponge. In cellular metal the space is divided into distinct cells. The boundaries of the cells are made of solid metal, and the interiors of the cells are voids. Preferably, the individual cells are separated from each other, but this is often not required. Porous metal (also called sintered metal) is a metal structure containing a multitude of pores, which is often formed from powdered metal, the individual elements thereof being formed into a unitary structure. In metal sponge structures, space is filled by pieces of metal that form a continuous network and coexist with a network of interconnected voids. These categories of metal foams, however, are loosely defined, and it is often difficult to fit a finished product within one of the categories due to the inherent imperfections in the material which are apparent when dealing with structures on the scale of metal foams. Therefore, as used in this disclosure, a metal foam is to be understood to be any metal structure containing voids, including those which may fall into one or more of the aforementioned categories.

Figure 3:
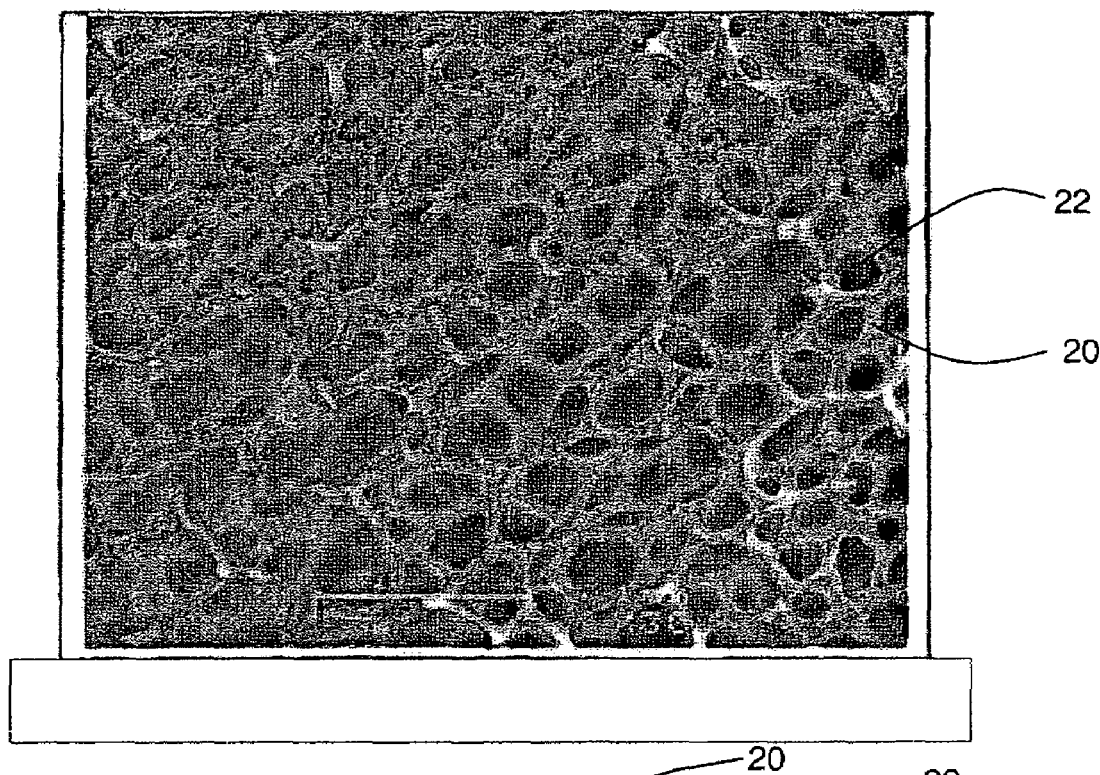
FIG. 3 is a magnified view of a lattice structure of a conductive post according to an embodiment of the present invention.
Figure 4:
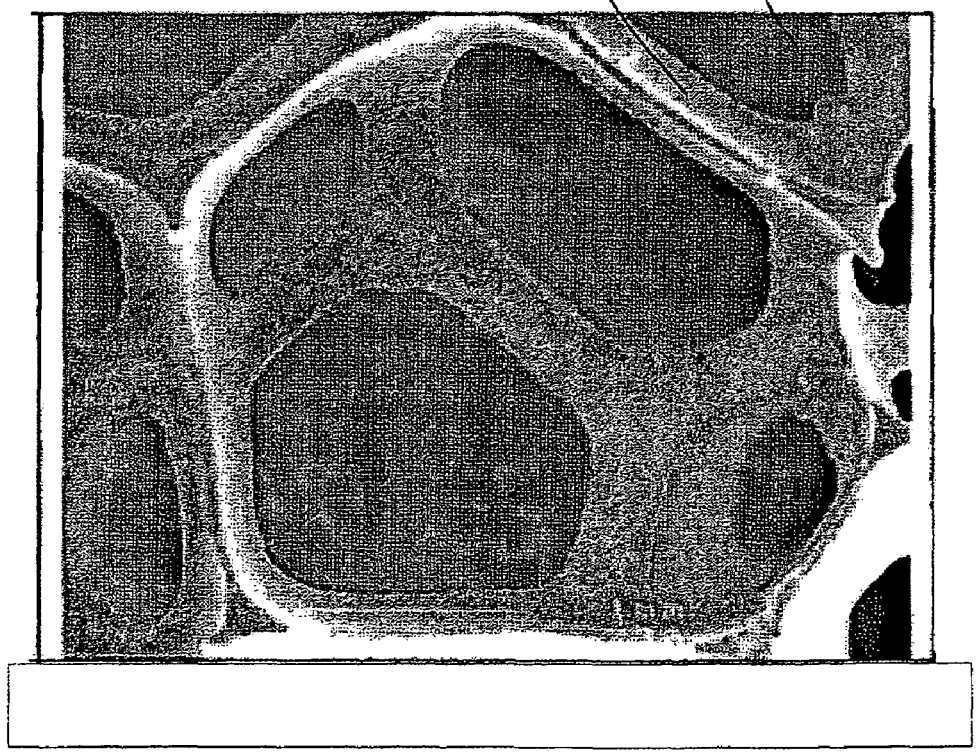
FIG. 4 is a magnified view of a lattice structure of a conductive post according to an embodiment of the present invention.

An example of a metal foam at various magnification levels is shown in FIGS. 3 and 4, in which the metal forms a lattice structure of interconnected metal elements 20 with voids 22 therebetween. As shown in FIGS. 3 and 4, voids 22 may be interconnected, but this is not necessary. Metal foams are generally referred to as having a porosity, which may be defined as the percent of the total volume of the metal foam which comprises voids 22. For example, metal foams exist which have a porosity of at least 50%, meaning that at least 50% of the foam metal is comprised of voids. FurtL-her, metal foams are available having porosities of at least 95%. Still further, metal foams exist having porosities of at least 99%.

An exemplary metal foam for use in posts 98 is one which is made from nickel. Generally, pure nickel in solid bulk form has a modulus of elasticity of about 150 GPa. Although the nickel in the lattice of nickel metal foam has the same mechanical properties as bulk nickel, including modulus of elasticity, the porosity of the structure gives nickel foam an effective, or apparent, modulus of elasticity of, for example, about 0.1 GPa. Depending on bulk material characteristics and the porosity of the foam metal, the apparent modulus of elasticity can vary from about 0.1 GPa to about 5 GPa. Foam metals having porosity of about 75% or more and, more desirably, 90% or more are preferred to provide relatively low apparent modulus of elasticity. Additionally, the structure of the metal foam provides for an extended compressive plastic range of deformation over solid bulk nickel. The compressive plastic range of foam metal post 98 will vary with the structure and porosity of the metal. Preferably, metal foam post 98 is designed to provide a plastic range of at least 10%. Further, the metal foam post 98 may be formed to provide a plastic range of deformation of less than 80%. More preferably, a metal foam post is designed to provide a plastic range of about 20%. Copper and gold metal foam posts can be fabricated having similar properties to those discussed with respect to nickel.

Returning now to FIGS. 1 and 2, each post 98 is connected to the post end 102 of one of the traces 96. In the particular embodiment of FIGS. 1 and 2, the posts 98 extend upwardly through the dielectric sheet 92, from the post ends of the traces 96. Alternatively, traces 96 can be disposed on the side of flexible sheet 90 away from microelectronic element 82 and posts 98 can extend upwardly from traces 96. The dimensions of the posts can vary over a significant range, but most typically the height $h_p$ of each post above the top surface 92 of the flexible sheet is about 50-300 μm. Each post has a base 74 adjacent the flexible sheet 90 and a tip 76 remote from flexible sheet 80. In the particular embodiment illustrated, the posts are generally frustoconical, so that the base 74 and tip 76 of each post are substantially circular. The bases of the posts typically are about 100-600 μm in diameter, whereas the tips typically are about 40-200 μm in diameter.

As best appreciated with reference to FIG. 2, the support ends 100 of the leads may be disposed in a regular grid pattern corresponding to the grid pattern of the support elements, whereas the posts 98 may be disposed in a similar grid pattern. However, the grid pattern of the posts is offset in the first and second horizontal directions, x and y, from the grid pattern of the support ends 100 and support elements 88, so that each post 98 is offset in the −y and +x directions from the support end 100 of the trace 96 connected to that post.

The support end 100 of each trace 96 overlies a support element 88 and is bonded to such support element, so that each post 98 is connected to one support element. In the embodiment illustrated, where the support elements are solder balls, the bonds can be made by providing the support elements on the contacts 83 of the chip and positioning the substrate or flexible sheet 90, with the posts and traces already formed thereon, over the support elements and reflowing the solder balls by heating the assembly. In a variant of this process, the solder balls can be provided on the support ends 100 of the traces. The process steps used to connect the support ends of the traces can be essentially the same used in flip-chip solder bonding of a chip to a circuit panel.

As mentioned above, the posts 98 are offset from the support elements 88 in the x and y horizontal directions. Unless otherwise specified herein, the offset distance do (FIG. 2) between a post and a support element can be taken as the distance between the center of area of the base 74 (FIG. 1) of the post and the center of area of the upper end 77 (FIG. 1) of the support element 88. In the embodiment shown, where both the base of the post and the upper end of the support element have circular cross-sections, the centers of area lie at the geometric centers of these elements. Most preferably, the offset distance $d_o$ is large enough that there is a gap 99 (FIG. 2) between adjacent edges of the base of the post and the top end of the support element. Stated another way, there is a portion of the dielectric sheet 90 in gap 99, which is not in contact with either the top end 77 of the support element or the base 74 of the post.

Each post lies near the center of one zone 89 defined by four adjacent support elements 88, so that these support elements are disposed around the post. For example, support elements 88a-88d are disposed around post 98a. Each post is electrically connected by a trace and by one of these adjacent support elements to the microelectronic device 82. The offset distances from a particular post to all of the support elements adjacent to that post may be equal or unequal to one another.

In the completed unit, the upper surface 92 of the substrate or flexible sheet 92 forms an exposed surface of the package, whereas posts 98 project from this exposed surface and provide terminals for connection to external elements. The conductive support elements 88 create electrically conductive paths between the microelectronic element 82 and the flexible substrate 90 and traces 96. The conductive support elements space the flexible substrate 90 from the contact bearing face 84 of microelectronic element 82. As further discussed below, this arrangement facilitates movement of the posts 98. Additional variations for microelectronic packages, in which metal foam posts may be used according to additional embodiments of the present invention are disclosed in co-pending U.S. patent application Ser. Nos. 10/985,119, 10/985,126, and 10/959,465, the disclosures of which are incorporated by reference herein. Merely by way of example, microelectronic packages of this type may be formed using a wafer-level process, wherein the flexible substrate, support elements and posts are attached to a wafer including a plurality of semiconductor chips and electrically connected to the chips. The wafer and the flexible substrate are then severed to form individual units, each including one or more chips and a portion of the substrate.

Figure 5:
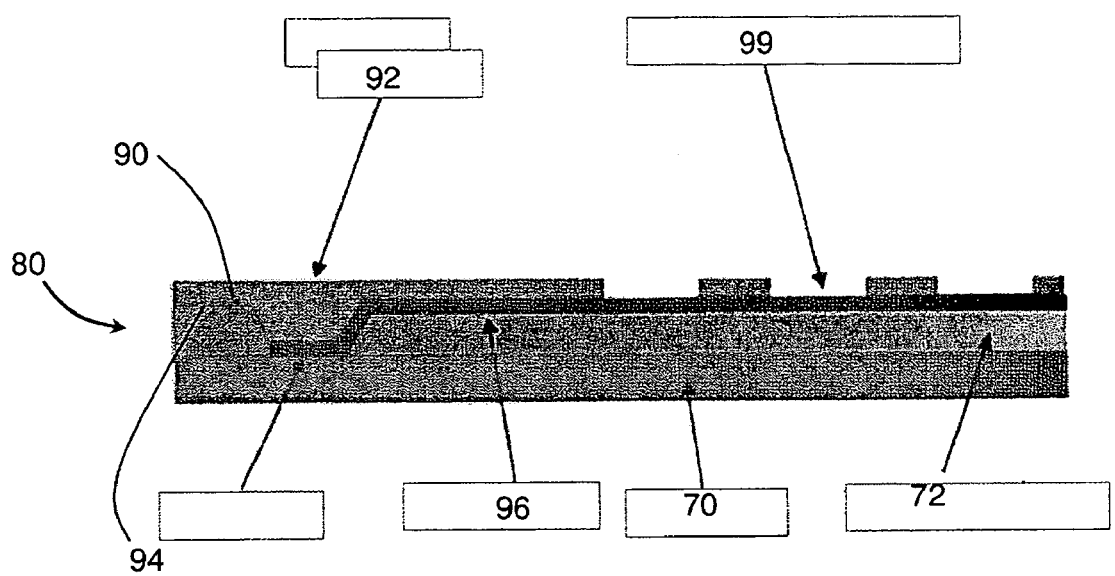
FIGS. 5-7 are diagrammatic sectional views depicting components during successive steps in a method of making a microelectronic component in accordance with another embodiment of the present invention.
Figure 6:
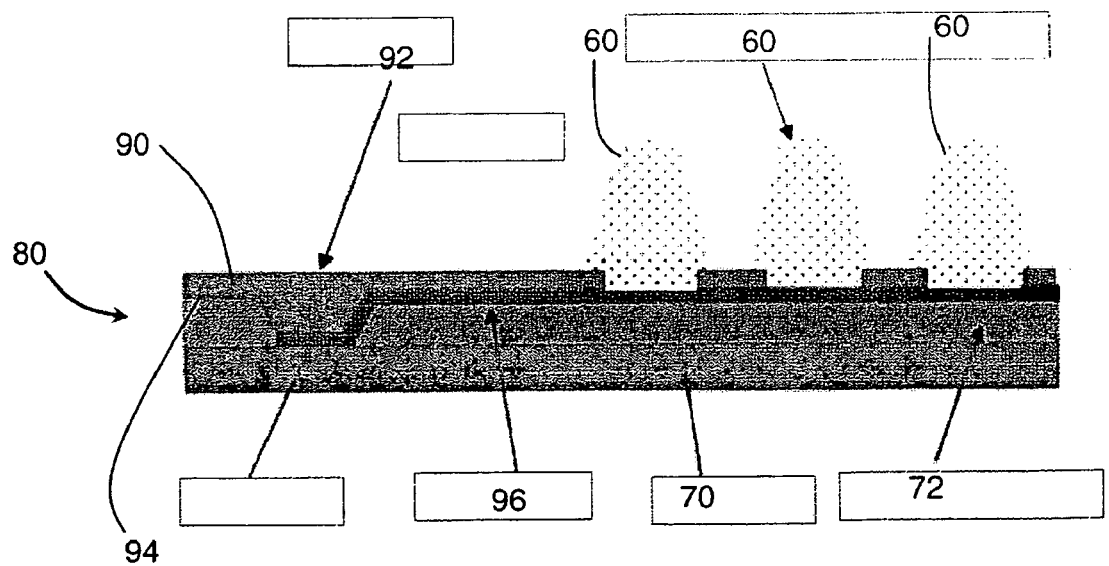

A method for fabricating posts 98 on a microelectronic component according to an embodiment of the invention is discussed with reference to FIGS. 5-7. In this embodiment, the microelectronic component includes a flexible dielectric sheet 90, preferably of polyimide, having a number of traces 96 exposed thereon. Methods for making such microelectronic components are known in the art. In the particular embodiment shown in FIG. 5, conductive trace 96 is disposed on the side of the dielectric layer which is opposite from the side from which posts 98 project. In such an embodiment, a hole 99 is formed in the dielectric layer 94 such that, when formed, post 98 can contact the trace. The microelectronic component is held on die or wafer 70 and may include a compliant layer 72 therebetween. As shown in FIG. 6, sacrificial bumps 60 are formed on the microelectronic component 80 in the desired locations for posts 98. Preferably, sacrificial bumps 60 are made from an open-cell polymer foam, but may be made from any open cell foam known in the art for making metal foams. Exemplary polymeric foams include those made from silicone, urethane, and acrylics. More preferably, the open-cell foam is made from an organic polymer such as polyurethane. Sacrificial bump 60 should be formed so as to approximately match the desired shape for post 98.

Preferably, sacrificial bump 60 is formed by standard patterning techniques, which are known in the art. One such technique is what is known as a stencil, print, and cure process. In this process, a "stencil" device is placed over dielectric layer 90 having holes therein which substantially match the desired shape for and location of sacrificial bumps 60. As with known stencils, the top of this device is left open, the height of the device substantially matching the desired height for sacrificial bumps 60. The uncured polymeric material is then disposed over the top of the device and allowed to flow into the holes therein and into contact with sheet 90 and traces 96. The top surface of the stencil is then wiped to remove excess material and the remaining material is allowed to cure. The material may include a blowing agent which undergoes a phase change or chemical reaction to evolve gas. The gas forms bubbles in the uncured material, which in turn form the voids in the foam. Alternatively or additionally, the curing reaction may involve evolution of a gas from the curing polymer itself. In still other material systems, internal shrinkage or loss of a component from the polymer may also generate voids. Once the material has cured, the stencil is removed, leaving sacrificial bumps 60 exposed on the surface of flexible sheet 90 and contacting traces 96 in the desired locations. Such a process may be carried out by methods including the use of an automated machine such as a DEK™ brand stencil printer.

Figure 7:
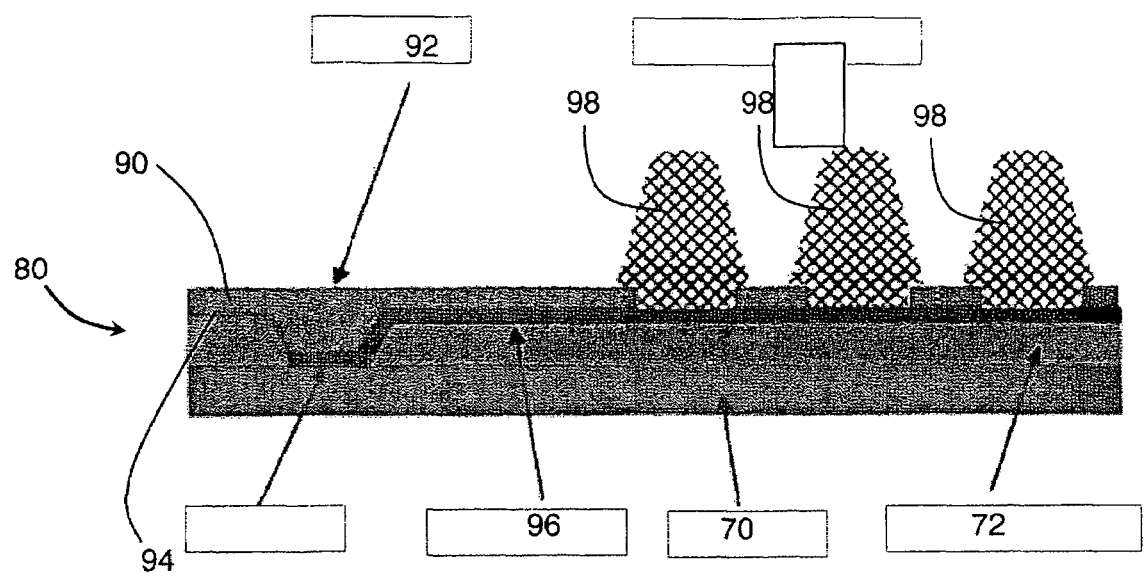

As shown in FIG. 7, once sacrificial bumps 60 are formed, the internal members of the polyurethane foam are coated with solid metal. In a preferred embodiment, this is done using a chemical vapor deposition (CVD) process. In one embodiment, nickel is deposited on the internal members of the polyurethane foam using CVD of nickel tetracarbonyl according to the following reaction:

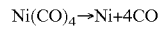

$$Ni(CO)_4 \rightarrow Ni + 4CO$$

In this CVD process, nickel tetracarbonyl is decomposed within a plater in the presence of a catalyst and a carrier gas. The low decomposition temperature of nickel tetracarbonyl allows for nickel deposition onto temperature-sensitive materials, such as polyurethane foam. After the plating operation has been completed, the deposited nickel foam still contains the polymeric substance, which may be left in place within the metal foam or may be removed. The polyurethane foam may be removed from the metal foam structure by subjecting the structure to a high-temperature heat treatment process (which is also referred to as a "burnout" process) or by chemical dissolution. In high-temperature heat treatment the microelectronic component, including the pins is subjected to a temperature sufficient to cause the foam material to decompose into a gaseous mixture, which then escapes from various openings which are inherently present in the metal foam structure. The temperature to which the microelectronic component is subjected should be high enough to cause decomposition of the sacrificial material, but sufficiently low so as not to damage the various components of microelectronic component 80, including posts 98, traces 96 or dielectric layer 90. For example, the temperature during the burnout operation may be about 250 degrees, Celsius.

Alternatively, chemical dissolution can be used to remove the sacrificial polymer foam from post 98. In such a process, a chemical which dissolves and/or reacts with the polymer is contacted with the polymer, thereby dissolving the polymer. When using chemical dissolution to remove the sacrificial polymer, the chemical should be selected so as to remove the polymer without damaging the metal portion of post 98, the traces 96 or the flexible sheet 90. Suitable chemicals for this purpose will vary with the material selected to form sacrificial bump 60, but may include various organic solvents, such as acetone, MEK, etc.

Alternative methods for manufacturing posts 98 on a microelectronic component 80 according to an embodiment of the invention include forming posts 98 as individual elements from stock pieces of metal foam, which are generally commercially available. Posts 98 may then be affixed to the desired locations on the flexible substrate 90 using various conductive adhesives or solder, or using welding processes. Additionally, a stock foam metal sheet may be attached over a specified portion of flexible substrate 90 using various known methods. The stock foam metal may then be mechanically etched by known methods to form posts 98 in the desired locations.

Following formation of posts 98, regardless of whether the sacrificial polymer has been removed or left in place, a finish can be applied to posts 98. Preferably, the finish includes at least one layer of gold. When gold is used as a layer for the coating, it is desired to apply the gold over nickel, because of the slow diffusion of gold over nickel, which maintains the purity of the gold for a longer period of time. If nickel is used to form posts 98, then a layer of gold can be applied directly to posts 98; however, if another material is used to form posts, it is preferred that a layer of nickel be applied to posts 98 prior to application of the layer of gold (the resulting coating being known in the art as a nickel-gold coating). Nickel-gold finishes are known in the art for use in microelectronic applications and are generally formed by applying a coating of nickel followed by a coating of gold. Nickel-gold and other finishes can be applied to posts 98 using a wet-plating process. In such a process, posts 98 are dipped into a bath consisting of a solution containing metal, such as nickel or gold at a temperature generally between 75 and 150 degrees, Celsius. The metal deposits from the solution by an autocatyltic or exchange reaction, commonly referred to as an electroless deposition process. Subsequent layers of metal are applied by the same process, as desired. Adhesion of the metal to the posts can be enhanced by using what is known as an electrolytic process, whereby the metal within the solution and the posts 98 are imparted with opposite electrical charges by use of a current. This causes the atoms in the metal to be attracted to the oppositely-charged atoms in the post, thereby furthering adherence therebetween. The application of a finish to posts 98 may facilitate the application of a solder to posts 98 and can minimize the electrical resistance of temporary contacts when posts 98 are pressed against pads on a PCB.

Figure 8:
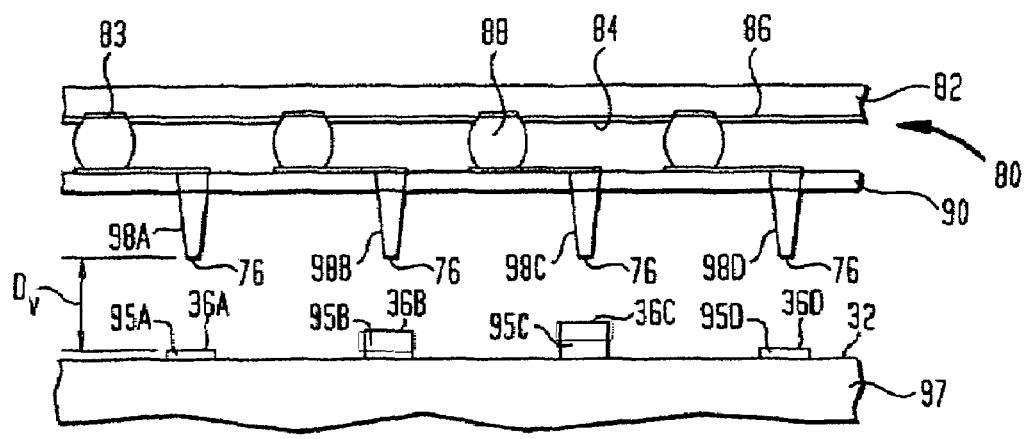
FIGS. 8-10 are diagrammatic sectional views depicting components during successive steps in a method of making a microelectronic component in accordance with another embodiment of the present invention.

In a method of operation according to a further embodiment of the invention, a microelectronic package 80 such as the package discussed above with reference to FIGS. 1 and 2 is tested by juxtaposing the conductive posts 98 with contact pads 95 on a second microelectronic element 97 such as a circuitized test board (FIG. 8). The conductive posts 98A-98D are placed in substantial alignment with top surfaces of the respective contact pads 95A-95D. As is evident in FIG. 8, the top surfaces 36A-36D of the respective contact pads 95A-95D are disposed at different heights and do not lie in the same plane. Such non-planarity can arise from causes such as warpage of the circuit board 97 itself and unequal thicknesses of contact pads 95. Also, although not shown in FIG. 8, the tips 76 of the posts may not be precisely coplanar with one another, due to factors such as unequal heights of support elements 88; non-planarity of the front surface 84 of the microelectronic device; warpage of the dielectric substrate 90; and unequal heights of the posts themselves. Also, the package 80 may be tilted slightly with respect to the circuit board. For these and other reasons, the vertical distances Dv between the tips of the posts and the contact pads may be unequal.

Figure 9:
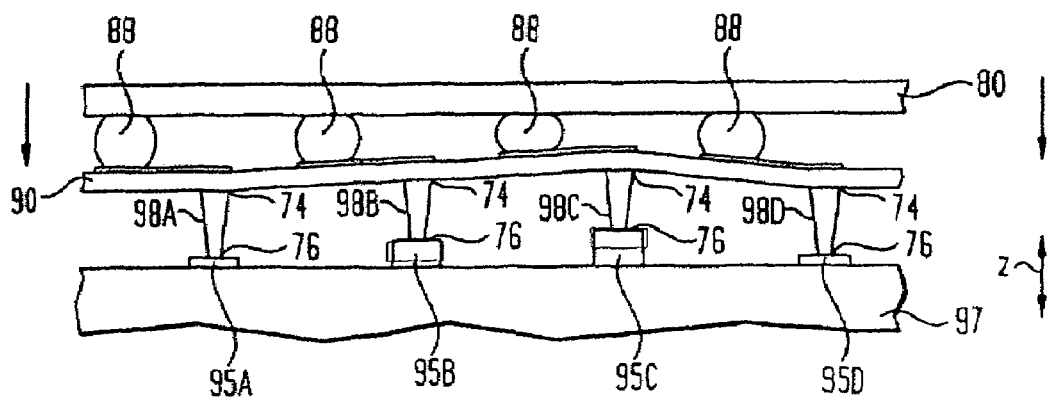

Referring to FIG. 9, microelectronic package 80 is moved toward test board 97, by moving either the test board, the package or both. Tips 76 of the conductive posts 98A-98D engage contact pads 95 and make electrical contact with contact pads 95. Tips 76 of posts 98 are able to move so as to compensate for the initial differences in vertical spacing Dv (FIG. 8), so that all of tips 76 can be brought into contact with all of contact pads 95 simultaneously using only a moderate vertical force applied to urge microelectronic package 80 and test board 97 together. In this process, at least some of tips 76 of posts 98 are displaced in the vertical or Z-direction relative to other post tips.

Figure 10:
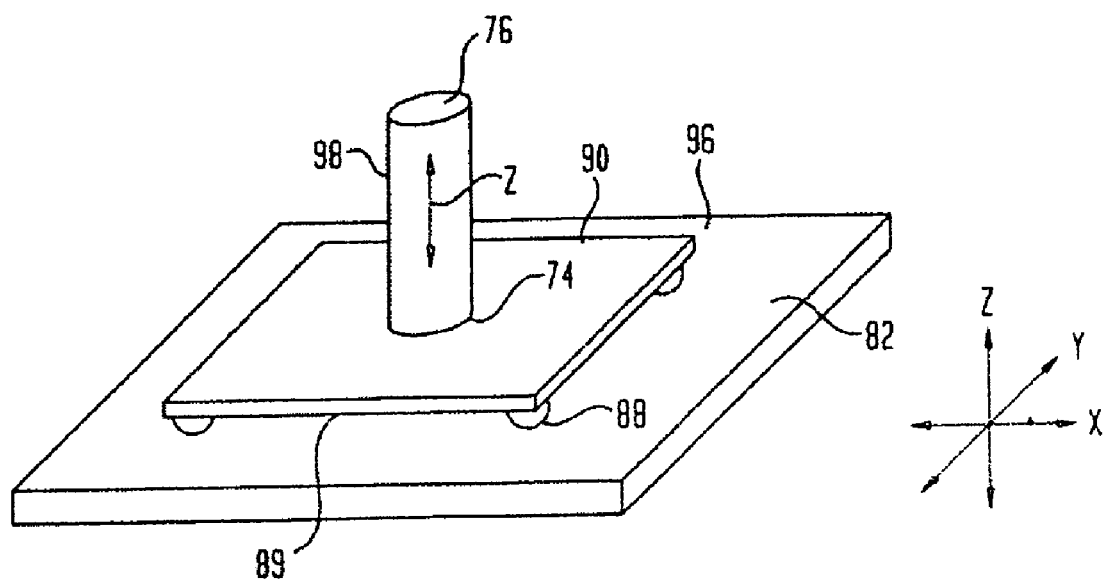

A portion of this relative displacement arises from the compression of posts 98, which is facilitated by the metal foam composition thereof. The compression of posts 98 may arise due to elastic deformation thereof or may extend to the range of plastic deformation. Another portion of the relative displacement of the tips of posts 98 may arise from movement of the bases 74 of the posts relative to one another and relative to microelectronic element 80. Because the posts are attached to flexible substrate 90 and are offset from the support elements 88, and because the support elements space the flexible substrate 90 from the front surface 84 of the microelectronic element, flexible substrate 90 can deform. Further, different portions of the substrate associated with different posts can deform independently of one another. An idealized representation of the deformation of a single region 89 of substrate 90 is shown in FIG. 10. The support elements 88 disposed at the corners of the region allow the central part of the region to bend downwardly toward the microelectronic element 82, allowing the base of post 98 to also move downward toward the microelectronic element. This deformation is idealized in FIG. 10 as a pure displacement of the post and the center of the region in the vertical or z direction. The proportion of the displacement of the tips 76 of posts 98 resulting from compression of posts 98 and deformation of the flexible substrate will vary based on the structure of the device. In particular, the relative moduli of elasticity of the posts 98 and the flexible substrate 90 will affect this proportion. For example, if posts 98 have a low modulus of elasticity compared to flexible sheet 90, then a majority of the movement of the tips of posts 98 may arise due to compression of posts 98. Conversely, if the modulus of elasticity of posts 98 is high compared to flexible sheet 90, then a majority of the movement of the tips of posts 98 may arise from deformation of the flexible sheet. Additional factors which may affect this proportion include, the distance between the base of post 98 and the conductive supports 88, the overall geometry of the flexible sheet, the geometry of posts, etc. In practice, the deformation of the substrate may vary in form, which may be due to material selection or the placement of posts relative to the supports, and the placement of the supports relative to one another. Such variation in deformation and the factors which contribute thereto are discussed in co-pending U.S. patent application Ser. No. 11/014,439, the entire disclosure of which is incorporated herein by reference.

The independent displacement of the posts tips 76 relative to one another allows all of the post tips 76 to contact all of the contact pads 95 on the test substrate. For example, the flexible substrate 90 in the vicinity of conductive post 98C flexes more than the flexible substrate in the vicinity of conductive post 98B and conductive post 98C compresses more than conductive post 98B. In turn, the flexible substrate 90 in the vicinity of conductive post 98B flexes substantially more than the flexible substrate in the vicinity of conductive post 98A and conductive post 98B compresses substantially more than 98A.

Because all of the post tips 76 can be engaged reliably with all of the contact pads 95, the package can be tested reliably by applying test signals, power and ground potentials through the test circuit board 97 and through the engaged posts and contact pads. Moreover, this reliable engagement is achieved with a simple test circuit board 97. For example, the contact pads 95 of the test circuit board are simple, planar pads. The test circuit board need not incorporate special features to compensate for non-planaricy or complex socket configurations. The test circuit board can be made using the techniques commonly employed to form ordinary circuit boards. This materially reduces the cost of the test circuit board, and also facilitates construction of the test circuit board with traces (not shown) in a simple layout compatible with high-frequency signals.

Figure 11:
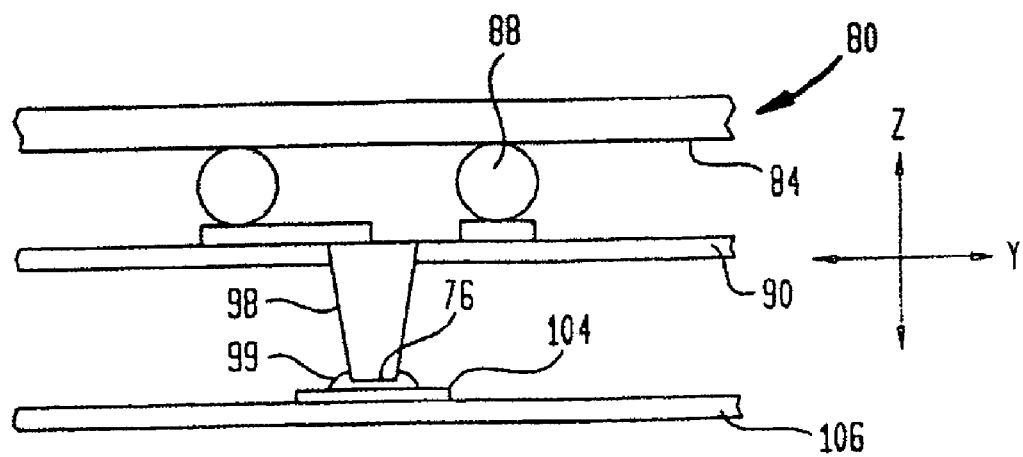
FIGS. 11-14 are diagrammatic sectional views depicting components during successive steps in a method of processing a microelectronic component in accordance with another embodiment of the present invention.

After testing, microelectronic package 80 may be removed from test circuit board 97 and permanently interconnected with another substrate such as a circuit panel 106 (FIG. 11) having contact pads 104, as by bonding the tips 76 of posts 98 to the contact pads of the circuit panel using a conductive bonding material 99 such as a solder. The solder-bonding process may be performed using conventional equipment commonly used for surface-mounting microelectronic components. Thus, the solder masses may be provided on the posts 98 or on the contact pads 104, and may be reflowed after engaging posts 98 with contact pads 104. During reflow, the surface tension of the solder tends to center the posts on the contact pads. Such self-centering action is particularly pronounced where the tips of the posts are smaller than the contact pads. Moreover, due to the cellular nature of the metal foam of which posts 98 are made, solder 99 flows into the voids 22 in the metal foam and interlaces with post 98 before solidifying. This creates a significantly stronger bond than with respect to a post formed of stock metal, wherein the solder merely wets the sides of the post.

Moreover, the tips 76 of the posts 98 can move relative to the microelectronic element 82 to at least some degree during service so as to relieve stresses arising from differential thermal expansion and contraction. As discussed above in connection with the testing step, the individual posts 98 can move relative to the microelectronic element and relative to the other posts by compression of posts 98 due to the metal foam structure and by flexure or other deformation of substrate 90. Such movement can appreciably relieve stresses in the solder bonds between the posts and the contact pads which would otherwise occur upon differential thermal expansion or contraction of the circuit board 106 and microelectronic element 80. Moreover, the conductive support elements or solder balls 88 can deform to further relieve stresses in solder masses 99. The assembly is highly resistant to thermal cycling stresses, and hence highly reliable in service. Alternatively, the assembly can be connected permanently or semi-permanently to a circuit board using a clamp mechanism which forcibly engages the tips of the posts with conductive features on the circuit board in the manner discussed above with reference to a test fixture.

Figure 12:
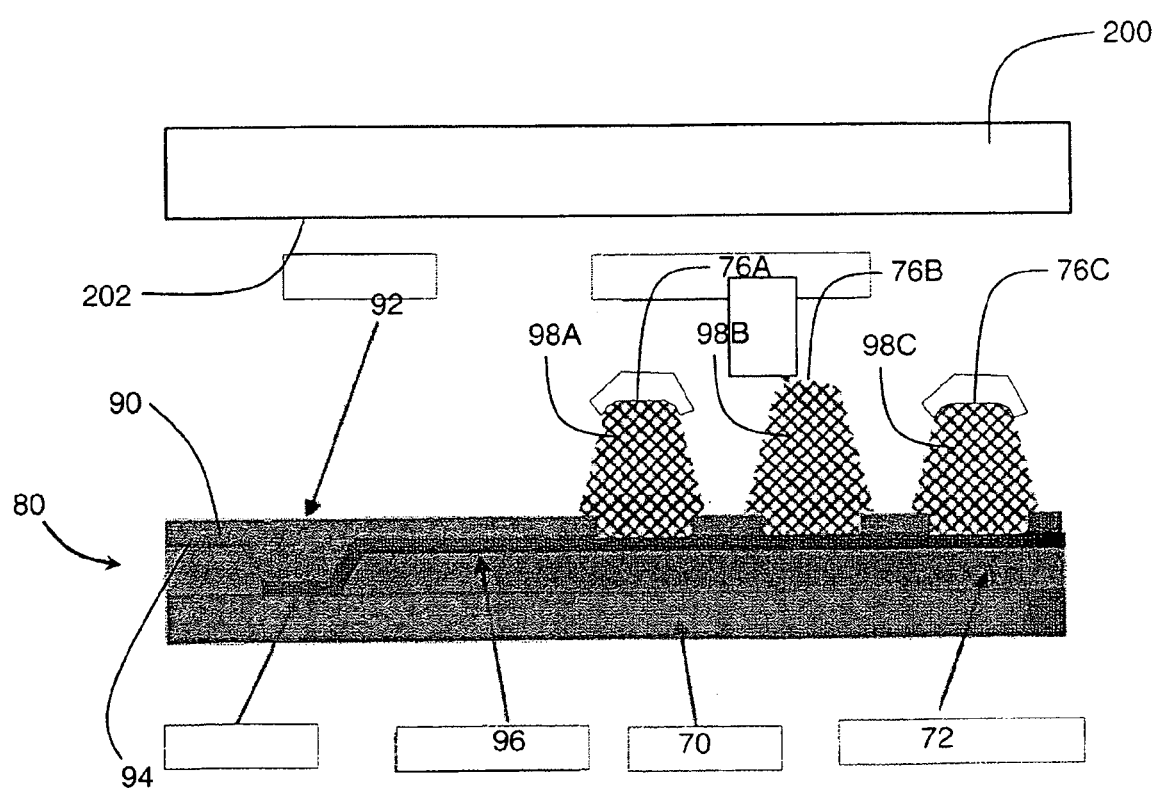
Figure 13:
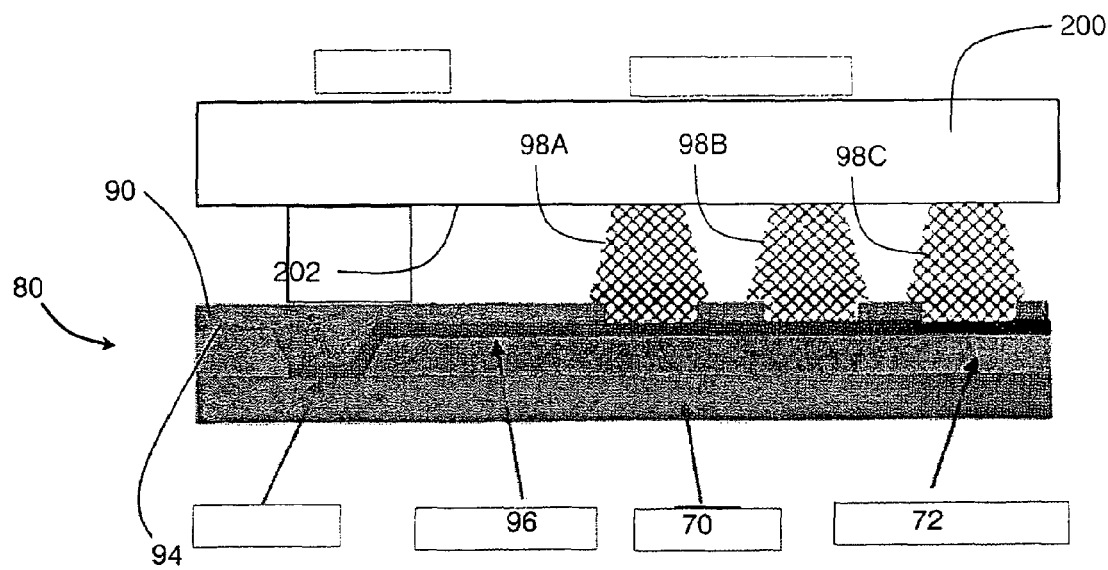
Figure 14:
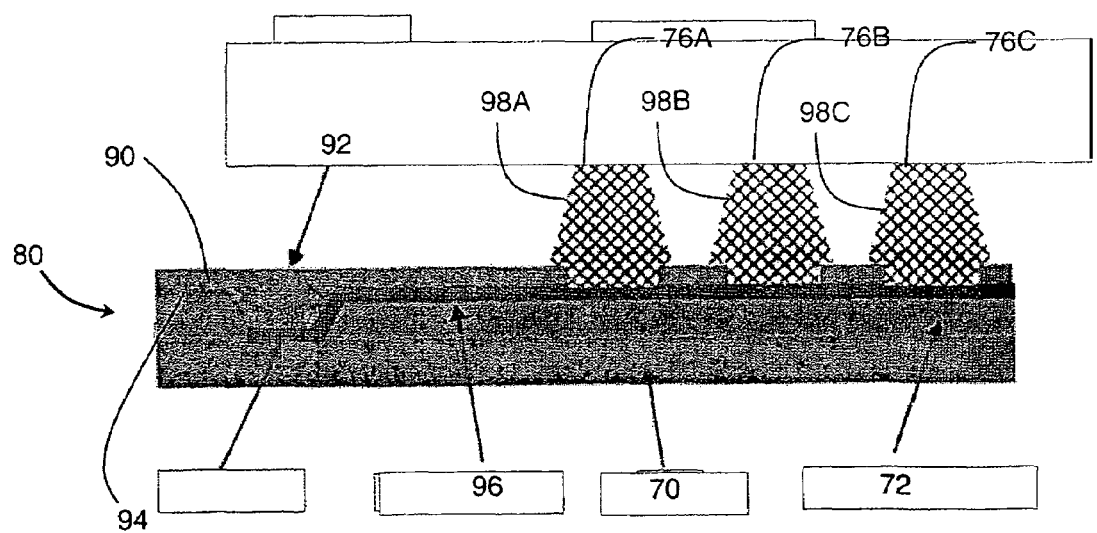

Due to various factors and conditions present in the formation of microelectronic element 80, tips 76 of posts 98 may not be co-planar. Additionally, due to previously-discussed methods for forming posts 98, the tips 76 of the plural posts 98 may have a rounded (or dome-like) shape, as opposed to the desired planar shape. Such conditions are disadvantageous when assembling microelectronic element 80 onto either a test circuit board or other substrate, but can be corrected using a planarization process. In a further embodiment of the present invention shown in FIGS. 12-14, a microelectronic component is advanced toward a coining fixture 200 having a substantially flat surface 202 thereon. Alternatively, coining fixture 200 can be advanced toward microelectronic component, or both can be advanced toward each other. Microelectronic component 80 is held substantially parallel to flat surface 202 as the microelectronic component is advanced such that posts 98 contact flat surface 202. Due to the non-planar condition of tips 76 of posts 98, one tip, for example 76B, may contact surface 202 before the remaining tips. When this happens, the microelectronic component is continued to be advanced toward surface 202 so that the post 98B is compressed, allowing other tips 76A, 76C to contact surface. This is continued until all tips 76A-C contact flat surface 202. This is preferably further continued until posts 98A-C begin to plastically deform. If the process is stopped during the elastic region, the compression of posts 98 will not be retained when the microelectronic component is withdrawn from coining fixture 200. If plastic deformation is achieved, then the compression is retained and the posts 98A-C are substantially made co-planar. A post 98 made from metal foam, by virtue of the small net metal content and the topography of the lattice structure, can accommodate significant plastic deformation at low applied stress. Once the desired compression for posts 98A-D is achieved, the microelectronic component is removed from coining fixture 100. Alternatively, coining fixture can be heated so that when posts 98 contact coining fixture 100 the metal foam is heated, thereby becoming malleable. The foam metal post 98 then takes the flat shape of the coining fixture and re-hardens when coining fixture 200 is removed in substantially the same shape.

Because of the extent of the range of deformation, elastic and/or plastic, that the metal foam construction of posts 98 provides, it is possible to provide a microelectronic element according to an embodiment of the present invention in which posts 98 are not offset from the support elements by a conductive trace, but rather are located directly thereunder, the two being connected by a conductive element which passes substantially vertically through the dielectric layer 90. The compressibility of posts 98 may allow for such supports to be non-compliant and/or inflexible. Furthermore, the compressibility of posts 98 may eliminate the need to include flexible substrate 90 in microelectronic package 80, allowing the microelectronic element 82 to be directly connected to a test circuit board or another substrate, without the need for the inclusion of flexible sheet 90 spaced apart from microelectronic element 82 by support elements 86.

Referring to FIG. 7, posts 98 of the present embodiment are constructed of metal foam and project in a direction away from contact pads or traces 96 which are exposed on a dielectric sheet 90. In this embodiment, the traces 96 and dielectric sheet 90 may be included in semiconductor chip arrangement, the posts 98 being appropriately located and formed so as to electronically connect the chip to a PCB or test fixture. As illustrated in FIG. 7, dielectric sheet 90 has a top face 92 and a bottom face 94 remote therefrom in the particular embodiment illustrated in FIG. 7, traces 96 are exposed on the bottom face 94 of dielectric sheet 90, but in other embodiments, traces 96 may extend on the top face 92, on both the top 92 and bottom 94 faces or within the interior of the substrate 90. Posts 98 are shown in FIG. 7 as projecting away from top face 92 of substrate 90, and are made from a metal foam as described with respect to other embodiments of the present invention. In other embodiments of the present invention, posts may project from the bottom surface 94 of the substrate 90, or wherever necessary in order to facilitate the desired electronic connection.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package, comprising:
a microelectronic component, comprising:
   a. a base having a flexible panel having first and second oppositely-directed faces; and
   b. a plurality of conductive posts extending from said base, each of said plurality of conductive posts having a volume thereof and being formed from a connected lattice of metal having voids therein, said posts projecting from said first face of said panel; and
a microelectronic element having faces and contacts spaced from and overlying said second face of said panel such that said plurality of conductive posts extend away from said microelectronic element, at least some of said conductive posts being electrically interconnected with said microelectronic element, each of the posts further having respective bases thereof, said bases being moveable with respect to said microelectronic element.

2. The microelectronic package of claim 1 further including a plurality of support elements disposed between said microelectronic element and said panel, at least some of said conductive posts being offset from said support elements.

3. The package of claim 1, wherein at least some of said support elements are electrically conductive, said conductive support elements electrically interconnecting at least some of the contacts of said microelectronic element with at least some of said conductive posts.

4. The package of claim 1, further comprising a plurality of traces in conductive communication with said posts and said microelectronic element.

5. The package of claim 1, further comprising an exposed finish metal overlying said connected lattice of metal.

6. The package of claim 3, wherein at least some of said posts are connected to at least some of said contacts by conductive support elements immediately adjacent to such posts.

7. The package of claim 6 further including conductive traces provided on said flexible panel, wherein said conductive traces electrically interconnect at least some of said conductive posts with at least some of said conductive support elements.

8. The package of claim 1, further comprising a compliant layer disposed between the flexible panel and said microelectronic element.

9. The package of claim 4, wherein said plurality of traces overlie and extend from said bases of posts.

* * * * *